(12) United States Patent
Jeon et al.

(10) Patent No.: US 9,552,771 B2
(45) Date of Patent: Jan. 24, 2017

(54) DISPLAY APPARATUS AND METHOD OF CONTROLLING THE SAME

(71) Applicant: SAMSUNG DISPLAY CO., LTD., Yongin, Gyeonggi-Do (KR)

(72) Inventors: Mukyung Jeon, Yongin (KR); Yongkoo Her, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 27 days.

(21) Appl. No.: 14/741,812

(22) Filed: Jun. 17, 2015

(65) Prior Publication Data

US 2016/0104409 A1  Apr. 14, 2016

(30) Foreign Application Priority Data

Oct. 10, 2014 (KR) ........................ 10-2014-0136970

(51) Int. Cl.
*G09G 3/3225* (2016.01)
*H01L 29/786* (2006.01)
*G09G 3/32* (2016.01)
*G02F 1/1362* (2006.01)

(52) U.S. Cl.
CPC .......... *G09G 3/3233* (2013.01); *G09G 3/3225* (2013.01); *H01L 29/786* (2013.01); *G02F 1/13624* (2013.01); *G09G 2300/0413* (2013.01); *G09G 2300/0819* (2013.01); *G09G 2300/0861* (2013.01); *G09G 2310/0216* (2013.01); *G09G 2330/021* (2013.01)

(58) Field of Classification Search
CPC ............... G09G 2300/0842–2300/0866; G09G 2300/0413; G09G 3/3225–3/3258; G09G 2330/08; G09G 2330/10; G09G 2300/0439; G09G 2300/0421
See application file for complete search history.

(56) References Cited

U.S. PATENT DOCUMENTS 6,741,037 B2 * 5/2004 Lee ....................... G09G 3/3233
                                                          315/169.1
7,157,847 B2 * 1/2007 Kawachi .............. G09G 3/3233
                                                          257/E27.111
(Continued)

FOREIGN PATENT DOCUMENTS

JP       2007-316511      12/2007
KR   10-2005-0035550 A    4/2005
(Continued)

*Primary Examiner* — Patrick F Marinelli
(74) *Attorney, Agent, or Firm* — Lee & Morse, P.C.

(57) ABSTRACT

A display apparatus includes a first pixel, a second pixel, and a dummy pixel. The first pixel includes a first light-emitting device connected to a first pixel circuit through a first node. The second pixel is in a same row as the first pixel and includes a second light-emitting device connected to a second pixel circuit through a second node. The dummy pixel includes at dummy pixel circuit with a third node. The controller outputs a first control signal having a first level or a second level based on a first pixel grayscale value corresponding to the first pixel and a second pixel grayscale value corresponding to the second pixel. A switch circuit electrically connects the first node, the second node, and a third node when the first control signal has the first level.

20 Claims, 8 Drawing Sheets

(56) References Cited

U.S. PATENT DOCUMENTS

| | | | | |
|---|---|---|---|---|
| 7,675,232 B2* | 3/2010 | Kawachi | G09G 3/3233 | 313/500 |
| 8,188,947 B2* | 5/2012 | Chung | G09G 3/3233 | 345/76 |
| 8,242,997 B2* | 8/2012 | Lee | G09G 3/3688 | 345/204 |
| 8,754,882 B2* | 6/2014 | Maekawa | G09G 3/3233 | 315/169.1 |
| 9,001,010 B2* | 4/2015 | Jeon | G06F 1/00 | 345/108 |
| 9,123,677 B2* | 9/2015 | Cho | H01L 27/3248 | |
| 9,189,992 B2* | 11/2015 | Hwang | G09G 3/3233 | |
| 9,286,820 B2* | 3/2016 | Chang | G09G 3/20 | |
| 9,349,776 B2* | 5/2016 | Lee | G09G 3/3233 | |
| 9,384,695 B2* | 7/2016 | Lee | G09G 3/3266 | |
| 9,391,125 B2* | 7/2016 | Kim | G09G 3/2003 | |
| 9,412,301 B2* | 8/2016 | In | G09G 3/2029 | |
| 2002/0024054 A1* | 2/2002 | Koyama | G09G 3/3266 | 257/84 |
| 2002/0075205 A1* | 6/2002 | Kimura | G09G 3/3659 | 345/55 |
| 2002/0180675 A1* | 12/2002 | Tobita | G09G 3/006 | 345/87 |
| 2003/0155612 A1* | 8/2003 | Kawachi | G09G 3/3233 | 257/344 |
| 2004/0017159 A1* | 1/2004 | Lee | G09G 3/3233 | 315/169.1 |
| 2007/0080918 A1* | 4/2007 | Kawachi | G09G 3/3233 | 345/92 |
| 2008/0079680 A1 | 4/2008 | Fujita | | |
| 2008/0191989 A1* | 8/2008 | Lee | G09G 3/3688 | 345/98 |
| 2009/0045751 A1* | 2/2009 | Peng | G09G 3/3233 | 315/169.2 |
| 2009/0309516 A1* | 12/2009 | Kim | G09G 3/3233 | 315/307 |
| 2011/0303930 A1 | 12/2011 | Bang et al. | | |
| 2012/0050344 A1 | 3/2012 | Kim et al. | | |
| 2012/0162275 A1* | 6/2012 | Park | H01L 27/3265 | 345/690 |
| 2013/0016083 A1* | 1/2013 | Maekawa | G09G 3/3233 | 345/211 |
| 2013/0201172 A1* | 8/2013 | Jeong | G09G 3/3233 | 345/212 |
| 2013/0293526 A1* | 11/2013 | Igawa | G09G 3/3696 | 345/212 |
| 2013/0300725 A1* | 11/2013 | Jeong | G09G 3/3233 | 345/212 |
| 2014/0022289 A1* | 1/2014 | Lee | G09G 3/3283 | 345/691 |
| 2014/0034923 A1* | 2/2014 | Kim | H01L 27/3297 | 257/40 |
| 2014/0118319 A1* | 5/2014 | Jeon | G06F 1/00 | 345/207 |
| 2014/0292827 A1* | 10/2014 | Kang | G09G 3/20 | 345/690 |
| 2014/0346475 A1* | 11/2014 | Cho | H01L 27/326 | 257/40 |
| 2014/0347401 A1* | 11/2014 | Hwang | G09G 3/3233 | 345/690 |
| 2015/0001540 A1* | 1/2015 | Chang | G09G 3/20 | 257/59 |
| 2015/0022513 A1* | 1/2015 | Kim | G09G 3/3225 | 345/212 |
| 2015/0097871 A1* | 4/2015 | Kumeta | G09G 3/2003 | 345/690 |
| 2015/0102302 A1* | 4/2015 | Kim | G09G 3/2003 | 257/40 |
| 2015/0102312 A1* | 4/2015 | Lee | G09G 3/3233 | 257/40 |
| 2015/0103103 A1* | 4/2015 | Kim | G09G 3/3233 | 345/690 |
| 2015/0108437 A1* | 4/2015 | Cho | H01L 27/3248 | 257/40 |
| 2015/0109189 A1* | 4/2015 | Hwang | G09G 3/3225 | 345/78 |
| 2015/0130787 A1* | 5/2015 | Chung | G09G 3/3225 | 345/214 |
| 2015/0138171 A1* | 5/2015 | Kim | H01L 27/3223 | 345/205 |
| 2015/0145905 A1* | 5/2015 | Kim | G09G 3/3208 | 345/694 |
| 2015/0161931 A1* | 6/2015 | Lee | G09G 3/3266 | 345/77 |
| 2015/0170562 A1* | 6/2015 | In | G09G 3/3258 | 345/80 |
| 2015/0170576 A1* | 6/2015 | Bae | G09G 3/3225 | 345/205 |
| 2015/0262526 A1* | 9/2015 | Park | G09G 3/3233 | 345/76 |
| 2015/0294616 A1* | 10/2015 | Jang | G09G 3/3208 | 345/691 |
| 2015/0294618 A1* | 10/2015 | Park | G09G 3/3291 | 345/214 |
| 2015/0294620 A1* | 10/2015 | Cho | G09G 3/3233 | 345/690 |
| 2015/0348466 A1* | 12/2015 | Park | G09G 3/3233 | 345/205 |
| 2016/0027412 A1* | 1/2016 | Igawa | G09G 5/18 | 345/213 |
| 2016/0035283 A1* | 2/2016 | Park | G09G 3/3258 | 345/214 |
| 2016/0104409 A1* | 4/2016 | Jeon | G09G 3/3225 | 345/690 |
| 2016/0104421 A1* | 4/2016 | Park | G09G 3/3233 | 345/212 |
| 2016/0118455 A1* | 4/2016 | Kang | G09G 3/20 | 257/40 |
| 2016/0140897 A1* | 5/2016 | Park | G09G 3/3225 | 345/77 |
| 2016/0140899 A1* | 5/2016 | Jeong | G09F 27/007 | 345/212 |
| 2016/0163243 A1* | 6/2016 | Park | G09G 3/3258 | 345/205 |
| 2016/0171914 A1* | 6/2016 | Chen | H04N 13/0404 | 345/209 |
| 2016/0189644 A1* | 6/2016 | So | G09G 3/3611 | 345/205 |
| 2016/0210892 A1* | 7/2016 | Ohara | G09G 3/3258 | |
| 2016/0217735 A1* | 7/2016 | Park | G09G 3/3233 | |

FOREIGN PATENT DOCUMENTS

| | | |
|---|---|---|
| KR | 10-2008-0030508 | 4/2008 |
| KR | 10-2011-0135734 | 12/2011 |
| KR | 10-2012-0019016 | 3/2012 |
| KR | 10-2012-0078443 A | 7/2012 |

* cited by examiner

DISPLAY APPARATUS AND METHOD OF CONTROLLING THE SAME

CROSS-REFERENCE TO RELATED APPLICATION

Korean Patent Application No. 10-2014-0136970, filed on Oct. 10, 2014, and entitled: "Display Apparatus and Method of Controlling the Same," is incorporated by reference herein in its entirety.

BACKGROUND

1. Field

One or more embodiments described herein relate to a display apparatus and a method for controlling a display apparatus.

2. Description of the Related Art

The pixels of a display apparatus consume a large amount of power. Reducing power consumption continues to be a focus of system designers. This is especially true for portable display apparatuses which are often battery driven.

SUMMARY

In accordance with one embodiment, a display apparatus includes a first pixel including a first light-emitting device connected to a first pixel circuit through a first node; a second pixel in a same row as the first pixel and including a second light-emitting device connected to a second pixel circuit through a second node; a first dummy pixel including a first dummy pixel circuit with a third node; a controller to output a first control signal having a first level or a second level based on a first pixel grayscale value corresponding to the first pixel and a second pixel grayscale value corresponding to the second pixel; and a switch circuit to electrically connect the first node, the second node, and a third node when the first control signal has the first level.

When the first pixel grayscale value equals the second pixel grayscale value, the controller may output the first control signal having the first level and the first dummy pixel circuit may output a driving current to the first and second light-emitting devices, and the driving current may correspond to the first pixel grayscale value.

The controller may compare the first pixel grayscale value with a threshold value, and the controller may output the first control signal having the first level when the first pixel grayscale value is greater than the threshold value. The switch circuit may include a plurality of switches to connect the first node, the second node, and the third node, and the display apparatus may include a switch controller to control states of the plurality of switches based on the first control signal.

The display apparatus may include a gate driver to output a first scan signal to the first pixel circuit and the second pixel circuit; and a source driver to output a data voltage, corresponding to the first pixel grayscale value, to the first pixel circuit of the first pixel and to output a data voltage, corresponding to the second pixel grayscale value, to the second pixel circuit of the second pixel in synchronization with the scan signal.

The gate driver may output the first scan signal to the first dummy pixel circuit, the source driver may output a black data voltage to the first pixel circuit and the second pixel circuit based on the first control signal having the first level, and a level of the black data voltage may equal to a level of a data voltage output by the source driver when a pixel grayscale value corresponds to black.

In response to the first control signal having the first level, the source driver may output a data voltage, determined based on the first pixel grayscale value, to the first dummy pixel circuit, and the first light-emitting device and the second light-emitting device may emit light with luminance corresponding to the first pixel grayscale value.

The display apparatus may include a scan line to transfer the first scan signal, output from the gate driver, to the first and second pixel circuits; and a switch connected between the gate driver and the scan line, wherein the switch may be opened based on the first control signal having the first level.

The first pixel circuit may include a pixel driving transistor connected between a source voltage terminal and the first node, the pixel driving transistor to be controlled based on a level of a voltage of the first pixel node; a pixel switching transistor connected between a first data voltage terminal and the first pixel node, the pixel switching transistor to be controlled based on a scan signal; and a first pixel capacitor connected between the source voltage terminal and the first pixel node.

The first dummy pixel circuit may include a dummy driving transistor connected between the source voltage terminal and the third node, the dummy driving transistor to be controlled based on a level of a voltage of the first dummy node; a dummy switching transistor connected between a dummy data voltage terminal and the first dummy node, the dummy switching transistor to be controlled based on the scan signal: and a first dummy capacitor connected between the source voltage terminal and the first dummy node.

A channel length of the dummy driving transistor may be shorter than a channel length of the pixel driving transistor. A channel width of the dummy driving transistor may be greater than a channel width of the pixel driving transistor.

The first pixel circuit may include a first pixel transistor connected between a second pixel node and a third pixel node, the first pixel transistor to be controlled based on a level of a voltage of a fourth node; a second pixel transistor to be connected between the second pixel node and a data voltage terminal, the second pixel transistor to be controlled based on a first scan signal; a third pixel transistor connected between the third pixel node and the fourth pixel node, the third pixel transistor to be controlled based on the first scan signal; a fourth pixel transistor connected between the fourth pixel node and an initialization voltage terminal, the fourth pixel transistor to be controlled based on a second scan signal; a fifth pixel transistor connected between the second pixel node and a source voltage terminal, the fifth pixel transistor to be controlled based on the second control signal; a sixth pixel transistor connected between the third pixel node and the first node, the sixth pixel transistor to be controlled based on the second control signal; a seventh pixel transistor connected between the first node and the initialization voltage terminal, the seventh pixel transistor to be controlled based on the second scan signal; and a second pixel capacitor connected between the source voltage terminal and the fourth pixel node.

The first dummy pixel circuit may include a first dummy transistor connected between a second dummy node and a third dummy node, the first dummy transistor to be controlled based on a level of a voltage of a fourth dummy node; a second dummy transistor connected between the second dummy node and the data voltage terminal, the second dummy transistor to be controlled based on the scan signal; a third dummy transistor connected between the third dummy node and a fourth dummy node, the third dummy transistor to be controlled based on the scan signal; a fourth dummy transistor connected between the fourth dummy node and the initialization voltage terminal, the fourth dummy transistor to be controlled based on the second scan signal; a fifth dummy transistor connected between the second dummy node and the source voltage terminal, the fifth dummy transistor to be controlled based on the second control signal; a sixth dummy transistor connected between the third dummy node and the third node, the sixth dummy transistor to be controlled based on the second control signal; a seventh dummy transistor connected between the third node and the initialization voltage terminal, the seventh dummy transistor to be controlled based on the second scan signal; and a second dummy capacitor connected between the source voltage terminal and the fourth dummy node.

The display apparatus may include a second dummy pixel including a second dummy pixel circuit; and a display including the first pixel and the second pixel are disposed, wherein, in response to the first control signal having the first level, the first dummy pixel circuit is to supply a driving current, corresponding to the first pixel grayscale value, to pixels in a same row as the first pixel among pixels left of the display, and wherein, in response to the first control signal having the first level, the second dummy pixel circuit is to supply a driving current, corresponding to the first pixel grayscale value, to pixels in a same row as the first pixel among pixels right of the display.

In accordance with another embodiment, a display apparatus includes a plurality of pixels, each of the pixels including a light-emitting device connected to a pixel circuit; and a plurality of dummy pixels in a dummy area, each of the dummy pixels including a dummy circuit connected to the light-emitting devices of pixels in a same row, wherein, when pixels in a first row have a first pixel grayscale value, the dummy circuit in the first row is to supply a driving current to light-emitting devices in the first row and wherein the driving current is to correspond to the first pixel grayscale value. When the first pixel grayscale value is greater than a threshold value, the dummy circuit in the first row may supply the driving current, corresponding to the first pixel grayscale value, to the light-emitting devices in the first row.

In accordance with another embodiment, a method for controlling a display apparatus includes receiving image data; comparing a first pixel grayscale value corresponding to a first pixel and a second pixel grayscale value corresponding to a second pixel; when the first pixel grayscale value is equal to the second pixel grayscale value, outputting a first control signal having a first level; and electrically connecting a first node, a second node, and a third node based on the first control signal having the first level, wherein the first and second pixels are in a same row, and wherein: the first node connects a first pixel circuit to a first light-emitting device in the first pixel; the second node connects a second pixel circuit to a second light-emitting device in the second pixel, and the third node is included in or coupled to a dummy pixel circuit.

Outputting the first control signal includes comparing the first pixel grayscale value with a threshold value; and when the first pixel grayscale value is equal to the second pixel grayscale value and the first pixel grayscale value is greater than the threshold value, outputting the first control signal having the first level. The method may include applying a data voltage, corresponding to the first pixel grayscale value, to the dummy pixel circuit; and emitting light having a luminance corresponding to the first pixel grayscale value using the first and second light-emitting devices, which receive a driving current from the dummy pixel circuit.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
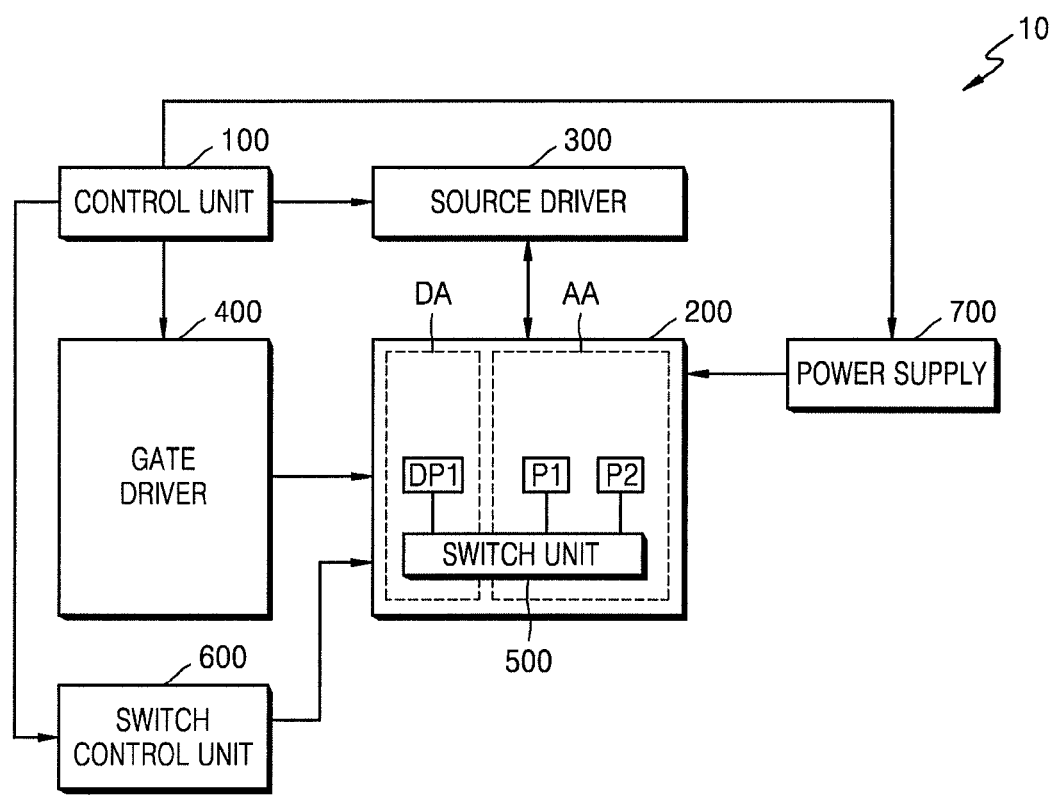
FIG. 1 illustrates an embodiment of a display apparatus.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a display apparatus 10 which includes a control unit 100, a display unit 200, a source driver 300, a gate driver 400, a switch unit 500, a switch control unit 600, and a power supply 700.

The display apparatus 10 may be a flat panel display apparatus such as but not limited to an organic light-emitting diode (OLED) display, a thin film transistor liquid crystal display (TFT-LCD), a plasma display panel (PDP), or a light-emitting diode (LED) display. The display apparatus 10 may be one of various apparatuses that output an image based on an image signal. For example, the display apparatus 10 may be an electronic apparatus such as a smartphone, a tablet personal computer (PC), a notebook PC, a monitor, or a television (TV), or may be an element of a corresponding electronic apparatus for displaying an image.

The control unit 100 receives an input image signal from a source, and outputs a signal for displaying an image based on the input image signal. The control unit 100 may transmit a control signal for controlling the display unit 200, the source driver 300, the gate driver 400, the switch control unit 600, and the power supply 700.

The input image signal may be received from the source, which, for example, may be external to the display apparatus 10. The image signal may include information for generating an image of a visible light area visible to human eyes through the display apparatus 10. The input image signal may be a digital signal or an analog signal.

An output signal of the control unit 100 is a signal for displaying the input image signal. The output signal may include, for example, an image signal obtained by applying image processing technology to the input image signal. The output signal may include various control signals for outputting a certain image through display unit 200.

The display unit 200 receives a data voltage and displays an image corresponding to the data voltage. The display unit 200 may be a flat display panel such as an OLED panel, an LC panel, or another type of display.

The display unit 200 includes an active area AA and a dummy area DA. The active area AA displays an image. The dummy area DA may be in a non-display area that does not display an image. The dummy area DA may be, for example, to the left and/or right of the active area AA. In one embodiment, the dummy area DA may be on and/or under the active area AA. In another embodiment, the dummy area DA may be in the active area AA.

The active area AA includes a plurality of pixels P, e.g., at least a first pixel P1 and a second pixel P2. The dummy area DA includes one or more dummy pixels DP, e.g., at least a first dummy pixel DP1.

In FIG. 1, only the first pixel P1, the second pixel P2, and the first dummy pixel DP1 are illustrated, with the understanding that a plurality of pixels P constituting a plurality of rows and a plurality of columns may be disposed in the active area AA of the display unit 200. Also, dummy pixels DP in rows equal, for example, to the number of rows of the active area AA and in one or more columns, may be in the dummy area DA.

One pixel P may include one or more sub-pixels. For example, the one pixel P may include a first sub-pixel for emitting red light, a second sub-pixel for emitting green light, and a third sub-pixel for emitting blue light. In one embodiment, a pixel P may denote one sub-pixel, or may denote one unit pixel including a plurality of sub-pixels.

The source driver 300 receives a signal from the control unit 100, and respectively outputs data voltages to the pixels P and dummy pixels DP of the display unit 200 based on the received signal.

The gate driver 400 receives a signal from the control unit 100 and outputs a scan signal to the display unit 200, based on the received signal.

The switch unit 500 is a connection unit that allows the first pixel P1, the second pixel P2, and the first dummy pixel DP1 to be electrically connected or disconnected. The switch unit 500 is controlled by the switch control unit 600.

The power supply 700 receives a signal from the control unit 100. The signal may be associated with power to be supplied to the display unit 200. The power supply 700 outputs power (e.g., a source voltage ELVDD (ELVSS) and an initialization voltage VINIT) for driving the display unit 200 to the display unit 200 based on the received signal.

In FIG. 1, the control unit 100, the source driver 300, the gate driver 400, the switch control unit 600, and the power supply 700 are illustrated as separate functional blocks. However, all or some of the control unit 100, the source driver 300, the gate driver 400, the switch control unit 600, and the power supply 700 may be implemented in separate integrated circuits (ICs) or may be implemented in one IC.

Figure 2A:
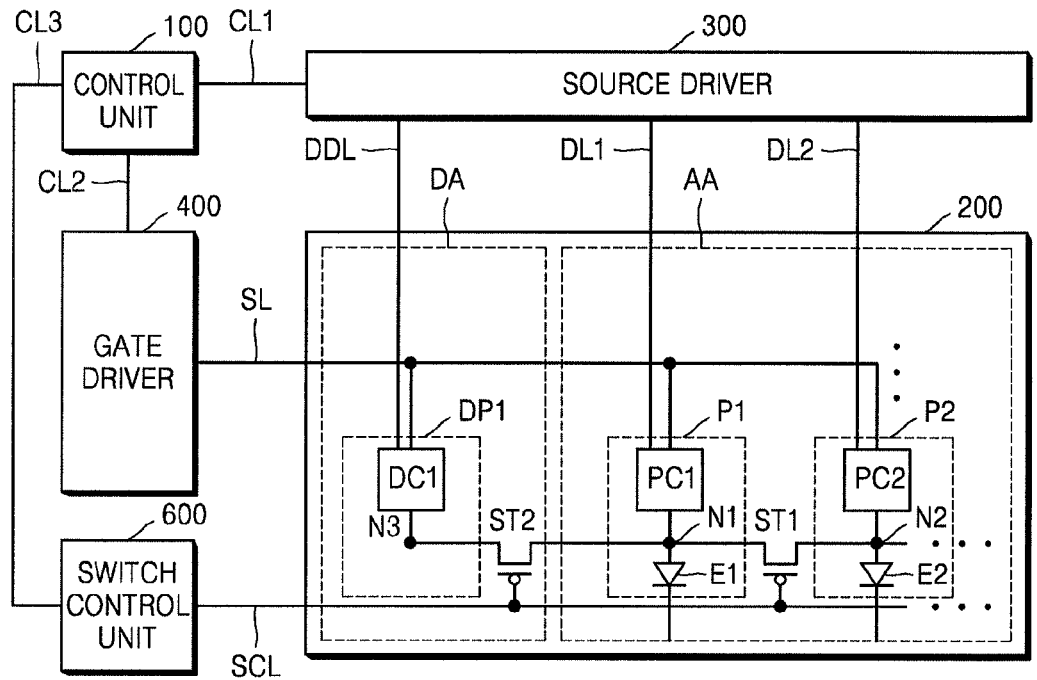
FIGS. 2A and 2B illustrate embodiments of a display unit.
Figure 2B:
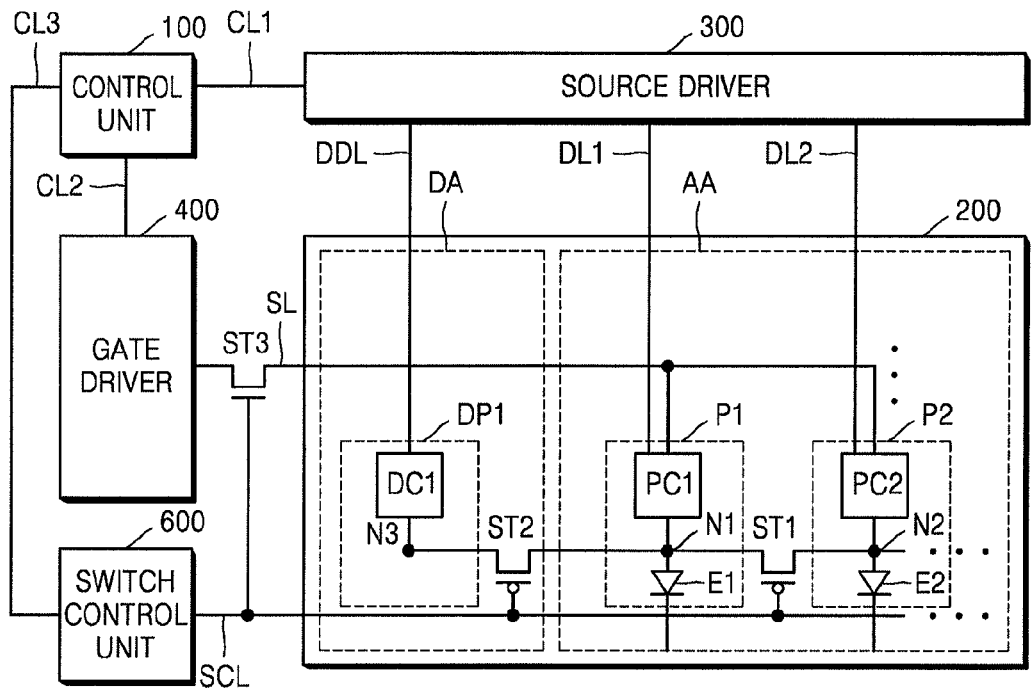

FIGS. 2A and 2B illustrate embodiments of the display unit 200. Referring to FIG. 2A, the first pixel P1 includes a first light-emitting device E1 connected to a first pixel circuit PC1 through a first node N1. The second pixel P2 includes a second light-emitting device E2 connected to a second pixel circuit PC2 through a second node N2. The second pixel P2 is in the same row as the first pixel P1. The first dummy pixel DP1 includes a first dummy pixel circuit DC1 and a third node N3. The first dummy pixel DP1 may be in the same row as the first pixel P1.

The control unit 100 outputs a first control signal to the switch control unit 600. The control unit 100 may output the first control signal to the source driver 300 and the gate driver 400. The control unit 100 may output the first control signal to the source driver 300, the gate driver 400, and the switch control unit 600 through a first control line CL1, a second control line CL2, and a third control line CL3. In FIG. 2A, each of the first control line CL1, the second control line CL2, and the third control line CL3 is illustrated as one line, but each may include a plurality of lines in another embodiment.

The control unit 100 may output the first control signal having one of first or second levels based on a first pixel grayscale value corresponding to the first pixel P1 and a second pixel grayscale value corresponding to the second pixel P2. For example, when the first pixel grayscale value is the same as the second pixel grayscale value, the control unit 100 may output the first control signal having the first level. When the first pixel grayscale value is different from the second pixel grayscale value, the control unit 100 may output the first control signal having the second level.

As another example, when the first pixel grayscale value is the same as the second pixel grayscale value and the first pixel grayscale value and the second pixel grayscale value are greater than a threshold value, the control unit 100 may output the first control signal having the first level. In a case where the first pixel grayscale value is the same as or different from the second pixel grayscale value, when the first pixel grayscale value and the second pixel grayscale value are less than the threshold value, the control unit 100 may output the first control signal having the second level. The threshold value may be determined as one value within a range of pixel grayscale values to be displayed by the display apparatus 10.

The source driver 300 applies a data voltage to the first pixel circuit PC1 through a first data line DL1. The source driver 300 applies a data voltage to the second pixel circuit PC2 through a second data line DL2. The source driver 300 applies a data voltage to the first dummy pixel circuit DC1 through a dummy data line DDL. A data voltage applied to each pixel circuit may be determined based on an image, which is to be displayed through the first light-emitting device E1 and the second light-emitting device E2, and the first control signal.

In FIG. 2A, the first data line DL1, the second data lines DL2, and the dummy data lines DDL are illustrated as lines through which data voltages are applied from the source driver 300 to the display unit 200. In another embodiment, a number of data lines equal to the number of columns of a plurality of pixels provided in the active area AA, and a number of data lines equal to the number of columns of a plurality of dummy pixels provided in the dummy area DA, may be connected between the source driver 300 and the display unit 200.

When the first control signal having the first level is input from the control unit 100 to the source driver 300, the source driver 300 may output a data voltage, corresponding to the first pixel grayscale value, to the first dummy pixel circuit DC1. When the first control signal having the second level is input from the control unit 100 to the source driver 300, the source driver 300 may output the data voltage, corresponding to the first pixel grayscale value, to the first pixel circuit PC1, and may output a data voltage, corresponding to the second pixel grayscale value, to the second pixel circuit PC2. The gate driver 400 outputs a first scan signal to the first pixel circuit PC1, the second pixel circuit PC2, and the first dummy pixel circuit DC1 through a scan line SL.

In FIG. 2A, only one scan line SL through which the scan signal is applied from the gate driver 400 to the display unit 200 is illustrated. In another embodiment, a number of scan lines equal to the number of rows of a plurality of pixels in the active area AA may be connected between the source driver 300 and the display unit 200.

The switch control unit 600 controls the switch unit 500 based on the first control signal. In FIG. 2A, the switch unit 500 is illustrated as including a first switching transistor ST1 and a second switching transistor ST2. In FIG. 2A, only the first switching transistor ST1 and the second switching transistor ST2 are illustrated as switching transistors in the switch unit 500. In another embodiment, the switch unit 500 may include transistors to electrically connect all pixels, provided on one row of the active area AA, and dummy pixels provided on the same row and in the dummy area DA.

When the first control signal having the first level is input from the control unit 100 to the switch control unit 600, the switch control unit 600 may output a voltage to gates of the first switching transistor ST1 and the second switching transistor ST2 through a switch control line STL. As a result, the first switching transistor ST1 and the second switching transistor ST2 turn on.

As illustrated in FIG. 2A, for example, each of the first switching transistor ST1 and the second switching transistor ST2 may be a positive-channel metal oxide semiconductor (PMOS) transistor. In this case, the switch control unit 600 may adjust a voltage of the switch control line STL in response to the first control signal having the first level. The adjusted voltage may be a voltage which enables a p-type channel, through which a positive hole is transferred between a p-type source and a p-type drain of each of the first switching transistor ST1 and the second switching transistor ST2, to be formed in an n-type body. Therefore, the first node N1, the second node N2, and the third node N3 may be electrically connected.

When the first control signal having the second level is input from the control unit 100 to the switch control unit 600, the switch control unit 600 may output a voltage to the gates of the first switching transistor ST1 and the second switching transistor ST2 through the switch control signal STL. The voltage may enable a channel not to be formed in a body of each of the first switching transistor ST1 and the second switching transistor ST2. Therefore, the first node N1, the second node N2, and the third node N3 may be electrically disconnected from each other.

As a result, when the first control signal having the first level is output from the control unit 100, the source driver 300 may output a data voltage, corresponding to the first pixel grayscale value, to the first dummy pixel circuit DC1. Also, the switch control unit 600 may control the first switching transistor ST1 and the second switching transistor ST2 to electrically connect the first node N1, the second node N2, and the third node N3. Therefore, a driving current corresponding to the first pixel grayscale value may be output from the first dummy pixel circuit DC1 to the first light-emitting device E1 and the second light-emitting device E2.

In the present embodiment, the configuration of the first pixel circuit PC1 may differ from the first dummy pixel circuit DC1, and an electrical characteristic of the first pixel circuit PC1 may differ from the first dummy pixel circuit DC1. Therefore, a data voltage corresponding to the first pixel grayscale value output to the first pixel circuit PC1 and a data voltage corresponding to the first pixel grayscale value output to the first dummy pixel circuit DC1 may be voltages having different levels.

When the first control signal having the first level is output from the control unit 100, a driving current may not be output from the first pixel circuit PC1 to the first light-emitting device E1. Also, a driving current may not be output from the second pixel circuit PC2 to the second light-emitting device E2. For example, the source driver 300 may output data voltage, corresponding to black, to the first pixel circuit PC1 and the second pixel circuit PC2.

When the first control signal having the second level is output from the control unit 100, the source driver 300 may output a data voltage, corresponding to the first pixel grayscale value, to the first pixel circuit PC1 and output a data voltage, corresponding to the second pixel grayscale value, to the second pixel circuit PC2. Also, the switch control unit 600 may control the first switching transistor ST1 and the second switching transistor ST2 to allow the first node N1, the second node N2, and the third node N3 to be electrically disconnected from each other. Therefore, a driving current corresponding to the first pixel grayscale value may be output from the first pixel circuit PC1 to the first light-emitting device E1. Also, a driving current corresponding to the second pixel grayscale value may be output from the second pixel circuit PC2 to the second light-emitting device E2.

Referring to FIG. 2B, the first pixel P1 includes a first light-emitting device E1 connected to a first pixel circuit PC1 through a first node N1. The second pixel P2 includes a second light-emitting device E2 connected to a second pixel circuit PC2 through a second node N2. The second pixel P2 is in the same row as the first pixel P1 in the display unit 200. The first dummy pixel DP1 includes a first dummy pixel circuit DC1 and a third node N3. The first dummy pixel DP1 may be in the same row as that of the first pixel P1.

The embodiment of FIG. 2A and the embodiment of FIG. 2B have a difference in that some elements are added to the embodiment of FIG. 2B. The following description will focus on some of these differences.

When the first scan signal having a first level is output from the control unit 100, a switch may allow the gate driver 400 not to be connected to the scan line SL. The switch may be configured with a third switching transistor ST3 connected between the gate driver 400 and the scan line SL. In this case, the third switching transistor ST3 may be a transistor having a type which differs from each of the first and second switching transistors ST1 and ST2. For example, when each of the first and second switching transistors ST1 and ST2 is a PMOS transistor, the third switching transistor ST3 may be a negative-channel metal oxide semiconductor (NMOS) transistor. Also, the third switching transistor ST3 may be controlled by a level of a voltage of the switch control line STL identical to the first and second switching transistors ST1 and ST2.

In this case, the first to third nodes N1 to N3 may be connected. Thus, when the first light-emitting device E1 and the second light-emitting device E2 are supplied with a driving current from the first dummy pixel circuit DC1, the scan signal may not be supplied to the first pixel circuit PC1 and the second pixel circuit PC2. As a result, a driving current corresponding to the first pixel grayscale value may be output from the first dummy pixel circuit DC1 to the first light-emitting device E1 and the second light-emitting device E2. Therefore, a driving current may not be output from the first pixel circuit PC1 to the first light-emitting device E1, and a driving current may not be output from the second pixel circuit PC2 to the second light-emitting device E2.

Figure 3:
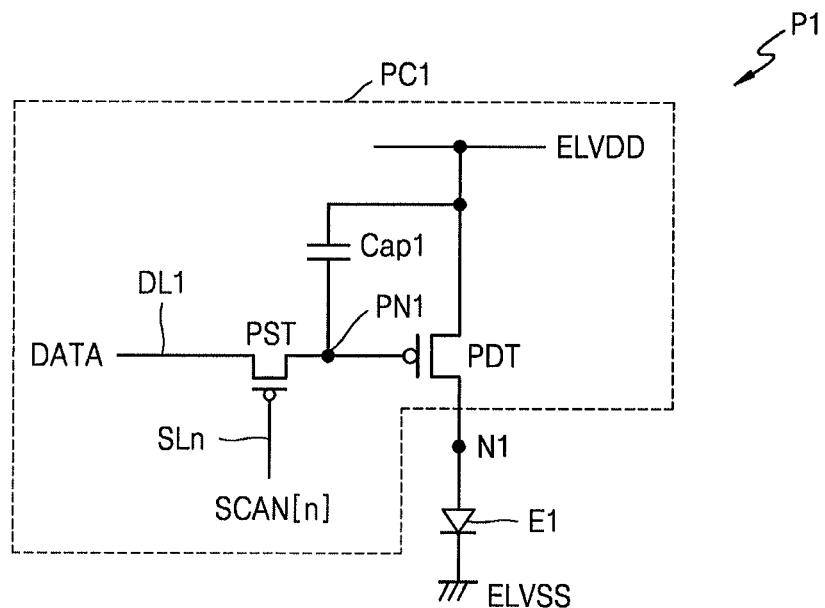
FIG. 3 illustrates an embodiment of a first pixel.

FIG. 3 illustrates an embodiment of a first pixel, which, for example, may correspond to first pixel P1. Referring to FIG. 3, the first pixel P1 includes a first pixel circuit PC1 having a pixel driving transistor PDT, a pixel switching transistor PST, and a first pixel capacitor Cap1.

For illustrative purposes only, it may be assumed that the first pixel P1 of FIG. 3 is in an nth row of the display unit 200. In this case, a scan signal SCAN[n] that determines a timing for applying data voltages to pixels P in the nth row, among pixels P provided in the active area AA, may be applied to the first pixel P1. The first pixel P1 may be a pixel disposed in an arbitrary column. For example, the first pixel P1 may be a pixel disposed in an mth column.

The pixel driving transistor PDT is connected between a source voltage terminal and a first node N1, and is controlled by the level of a voltage of a first pixel node PN1. The source voltage terminal supplies a source voltage ELVDD, from the power supply 700, to the pixels P of the display unit 200. The pixel driving transistor PDT outputs a driving current, corresponding to a data voltage input to the first pixel circuit PC1, to the first node N1.

The pixel switching transistor PST is connected between a first data voltage terminal and the first pixel node PN1, and is controlled by the scan signal SCAN[n] applied to a scan line SLn. The first data voltage terminal is a node which connects a first data line DL1 to the first pixel circuit PC1. The pixel switching transistor PST determines a timing when a voltage corresponding to a data voltage is charged to the first pixel capacitor Cap1, with reference to the scan signal SCAN[n].

The first pixel capacitor Capt is connected between a source voltage ELVDD terminal and the first pixel node PN1. The first pixel capacitor Capt holds a voltage difference between the source voltage ELVDD and the first pixel node PN1, so that a data voltage input to the first pixel circuit PC1 is held.

Figure 4:
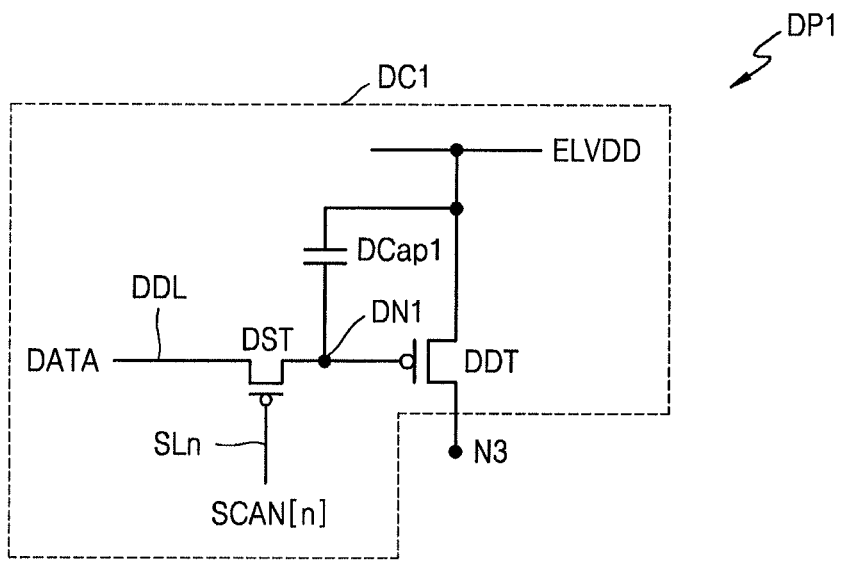
FIG. 4 illustrates an embodiment of a first dummy pixel.

FIG. 4 illustrates an embodiment of a first dummy pixel, which, for example may correspond to first dummy pixel DP1. Referring to FIG. 4, the first dummy pixel DP1 includes a first dummy pixel circuit DC1 having a dummy driving transistor DDT, a dummy switching transistor DST, and a first dummy capacitor DCap1. For illustrative purposes only, it may be assumed that the first dummy pixel DP1 of FIG. 4 is in an nth row. In this case, a scan signal SCAN[n], that determines a timing for applying data voltages to dummy pixels DP in the nth row among dummy pixels DP in the dummy area DA, may be applied to the first dummy pixel DP1.

The dummy driving transistor DDT is connected between a source voltage terminal and a third node N3, and is controlled by a level of a voltage of a first dummy node DN1. The dummy driving transistor PDT outputs a driving current, corresponding to a data voltage input to the first dummy pixel circuit DC1, to the third node N3.

The dummy switching transistor DST is connected between connected between a dummy data voltage terminal and the first dummy node DN1, and is controlled by the scan signal SCAN[n] applied to a scan line SLn. The dummy data voltage terminal is a node which connects a dummy data line DDL1 to the first dummy pixel circuit DC1. The dummy switching transistor DST determines a timing when a voltage corresponding to a data voltage is charged into the first dummy capacitor DCap1, with reference to the scan signal SCAN[n].

The first dummy capacitor DCap1 is connected between a source voltage ELVDD terminal and the first dummy node DN1. The first dummy capacitor DCap1 holds a voltage difference between the source voltage ELVDD and the first dummy node DN1 so that a data voltage input to the first dummy pixel circuit DC1 is held.

Figure 5:
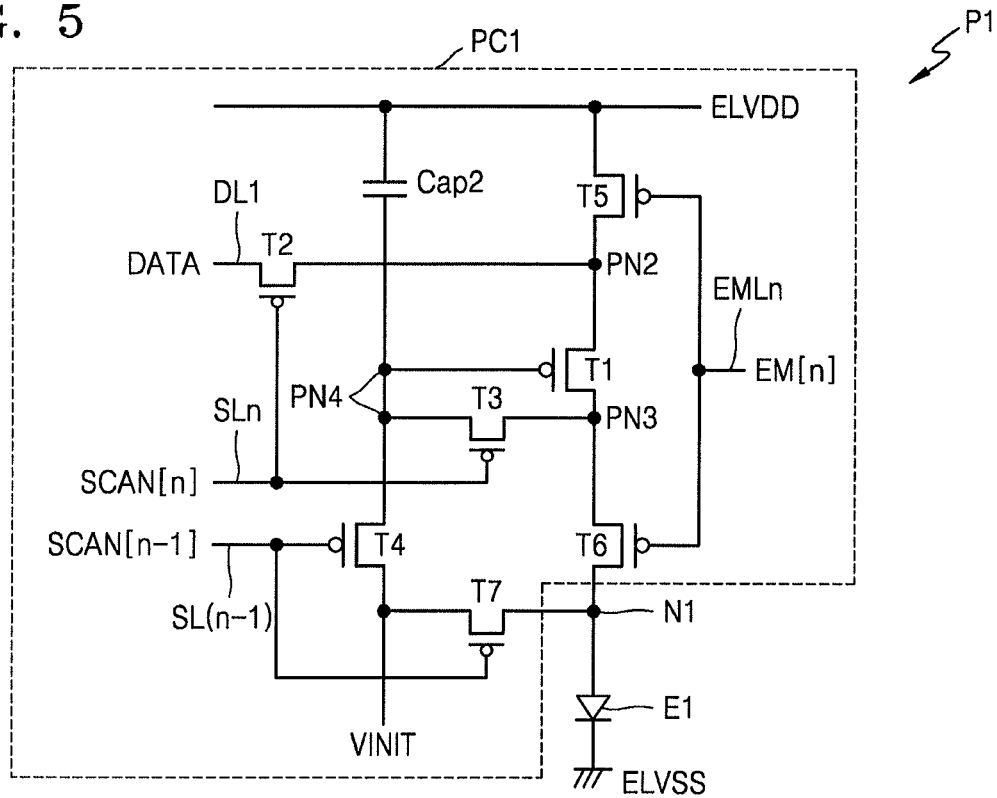
FIG. 5 illustrates another embodiment of a first pixel.

FIG. 5 illustrates another example of the first pixel P1. Referring to FIG. 5, the first pixel P1 includes a first pixel circuit PC1 having a first pixel transistor T1, a second pixel transistor T2, a third pixel transistor T3, a fourth pixel transistor T4, a fifth pixel transistor T5, a sixth pixel transistor T6, a seventh pixel transistor T7, and a second pixel capacitor Cap2. For illustrative purposes only, it is assumed that the first pixel P1 of FIG. 5 is in the nth row of the display unit 200. In this case, a scan signal SCAN[n], that determines a timing for applying data voltages to pixels P disposed on the nth row among pixels P in the active area AA, may be applied to the first pixel P1. The first pixel P1 may be a pixel in an arbitrary column, e.g., an mth column.

The first pixel transistor T1 is connected between a second pixel node PN2 and a third pixel node PN3, and is controlled by a level of a voltage of a fourth pixel node PN4. The first pixel transistor T1 outputs a driving current, corresponding to data voltage input to the first pixel circuit PC1, to a first node N1 and performs the same function as that of the pixel driving transistor PDT of FIG. 3.

The second pixel transistor T2 is connected between the second pixel node PN2 and a data voltage terminal, and is controlled by the scan signal SCAN[n] that determines a timing for applying the data voltages to the pixels P in the nth row.

The third pixel transistor T3 is connected between the third pixel node PN3 and the fourth pixel node PN4, and is controlled by the scan signal SCAN[n] that determines a timing for applying the data voltages to the pixels P in the nth row.

The fourth pixel transistor T4 is connected between the fourth pixel node PN4 and an initialization voltage terminal, and is controlled by a scan signal SCAN[n−1] that determines a timing for applying data voltages to pixels P in an n−1st row. The initialization voltage terminal supplies an initialization voltage VINIT, from the power supply 700, to the pixels P of the display unit 200. The initialization voltage VINIT is applied before a data voltage corresponding to a pixel grayscale value of a current frame is applied to a pixel circuit. The initialization voltage VINIT is applied so that the pixel circuit is not affected by a data voltage corresponding to a pixel grayscale value of a previous frame. (The scan signal SCAN[n] that determines a timing for applying the data voltages to the pixels P in the nth row may be referred to as a first scan signal, and the scan signal SCAN[n−1] that determines a timing for applying the data voltages to the pixels P in the n−1st row may be referred to as a second scan signal).

The fifth pixel transistor T5 is connected between the second pixel node PN2 and a source voltage terminal, and is controlled by a second control signal EM[n]. The second control signal EM[n] may simultaneously drive pixels P, for example, in one row or all pixels P in the active area AA without separately driving the pixels P of the active area AA.

The sixth pixel transistor T6 is connected between the third pixel node PN3 and the first node N1, and is controlled by the second control signal EM[n].

The seventh pixel transistor T7 is connected between the first node N1 and the initialization voltage terminal, and is controlled by the scan signal SCAN[n−1] that determines a timing for applying the data voltages to the pixels P in the n−1st row.

The second pixel capacitor Cap2 is connected between a source voltage terminal and the fourth pixel node PN4.

Figure 6:
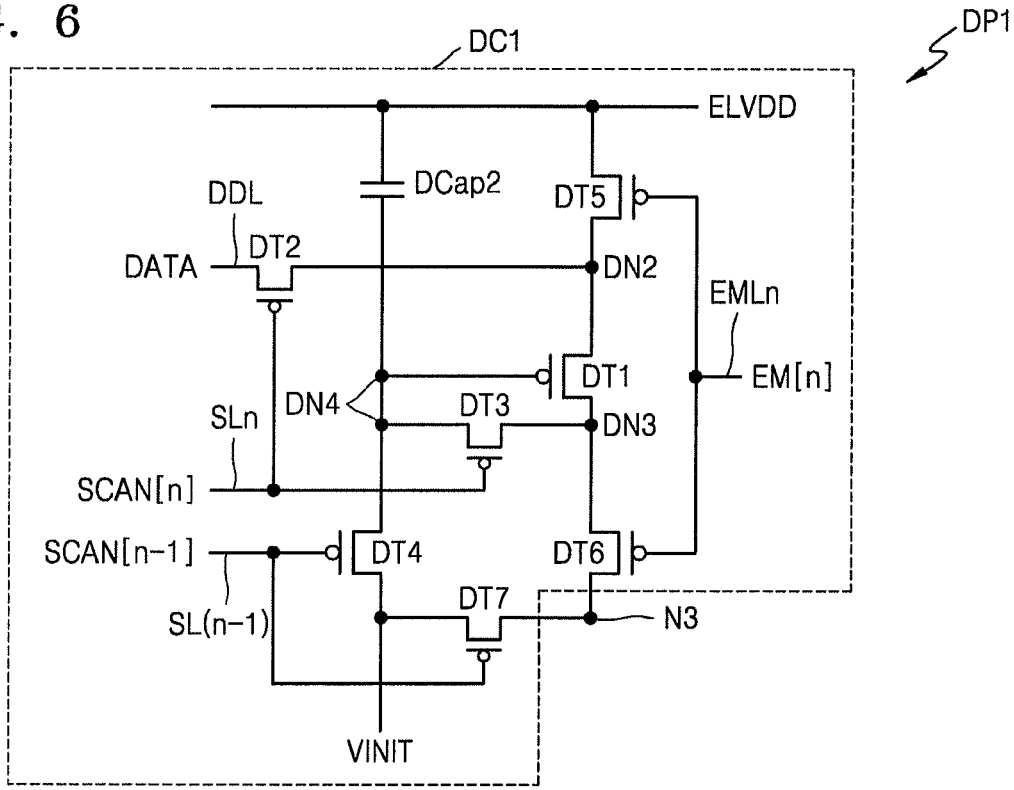
FIG. 6 illustrates another embodiment of a first dummy pixel.

FIG. 6 illustrates another embodiment of the first dummy pixel DP1. Referring to FIG. 6, the first dummy pixel DP1 includes a first dummy pixel circuit DC1 having a first dummy transistor DT1, a second dummy transistor DT2, a third dummy transistor DT3, a fourth dummy transistor DT4, a fifth dummy transistor DT5, a sixth dummy transistor DT6, a seventh dummy transistor DT7, and a second dummy capacitor DCap2. For illustrative purposes only, it is assumed that the first dummy DP1 of FIG. 6 is in an nth row of the display unit 200. In this case, a scan signal SCAN[n], that determines a timing for applying data voltages to dummy pixels DP in the nth row among dummy pixels DP in the dummy area DA, may be applied to the first dummy pixel DP1.

In FIG. 6, a scan signal output to the pixels P in the active area AA and a scan signal output to the dummy pixels DP in the dummy area DA are illustrated as SCAN, which is the same signal. In another embodiment, a pixel scan signal may be applied to the pixels P in the active area AA, and a dummy scan signal (which is a separate signal different from the pixel scan signal) may be applied to the dummy pixels DP in the dummy area DA. The pixel scan signal and the dummy scan signal may be output from the gate driver 400.

The first dummy transistor DT1 is connected between a second dummy node DN2 and a third dummy node DN3, and is controlled by a level of a voltage of a fourth dummy node DN4. The first dummy transistor DT1 outputs a driving current, corresponding to data voltage input to the first dummy circuit DC1, to a third node N3 and performs the same function as that of the dummy driving transistor DDT of FIG. 4.

The second dummy transistor DT2 is connected between the second dummy node DN2 and a data voltage terminal, and is controlled by the scan signal SCAN[n] that determines a timing for applying the data voltages to the dummy pixels DP in the nth row.

The third dummy transistor DT3 is connected between the third dummy node DN3 and the fourth dummy node DN4, and is controlled by the scan signal SCAN[n] that determines a timing for applying the data voltages to the dummy pixels DP in the nth row.

The fourth dummy transistor DT4 is connected between the fourth dummy node DN4 and an initialization voltage terminal, and is controlled by a scan signal SCAN[n−1] that determines a timing for applying data voltages to dummy pixels DP in an n−1st row.

The fifth dummy transistor DT5 is connected between the second dummy node DN2 and a source voltage terminal, and is controlled by a second control signal EM[n].

The sixth dummy transistor DT6 is connected between the third dummy node DN3 and the third node N3, and is controlled by the second control signal EM[n].

The seventh dummy transistor DT7 is connected between the third node N3 and the initialization voltage terminal, and is controlled by the scan signal SCAN[n−1] that determines a timing for applying the data voltages to the dummy pixels DP in the n−1st row.

The second dummy capacitor DCap2 is connected between a source voltage terminal and the fourth dummy node DN4.

Figure 7:
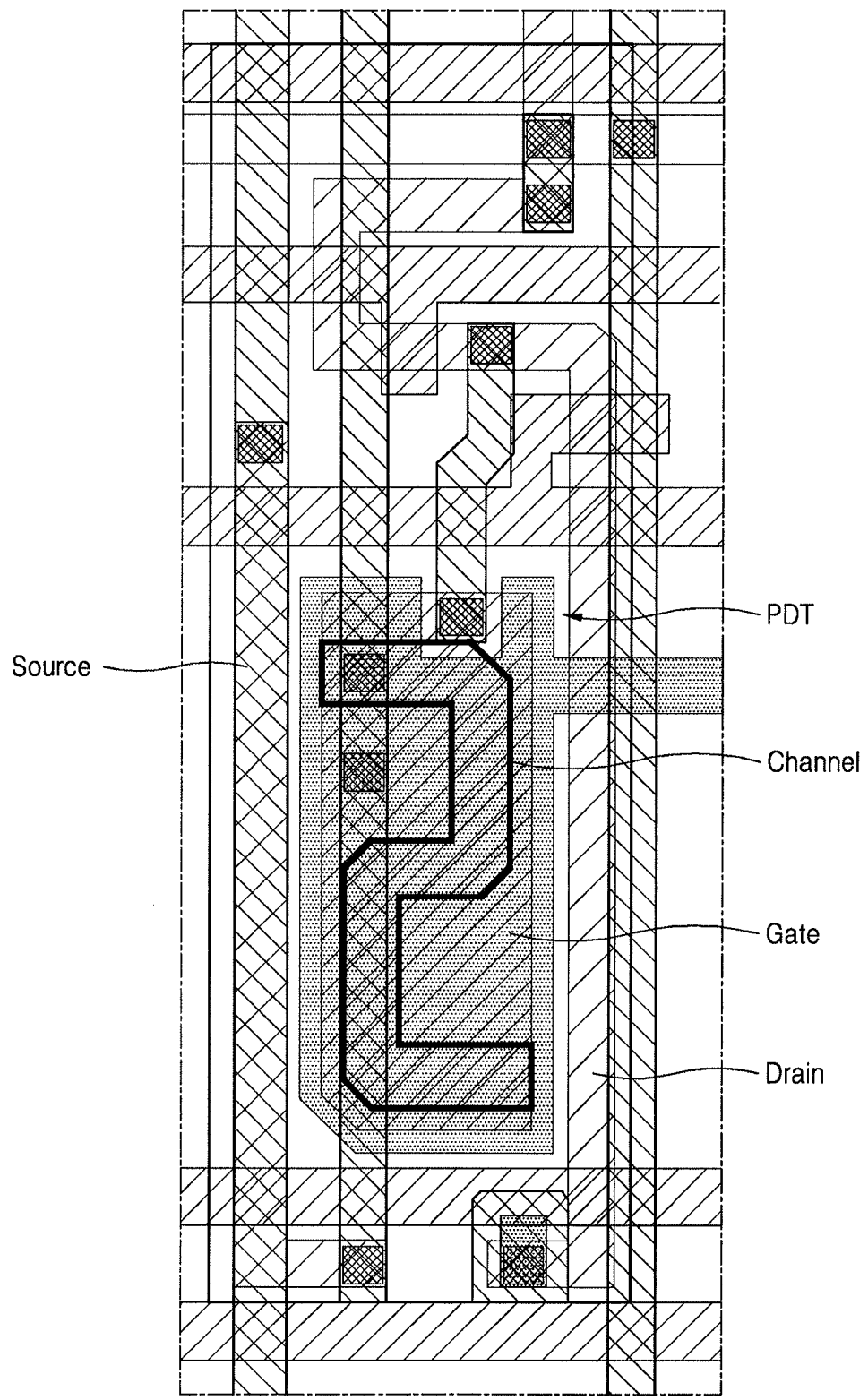
FIG. 7 illustrates an embodiment of a pixel driving transistor.

FIG. 7 illustrates an embodiment of a pixel driving transistor PDT in the pixel circuit of a pixel of FIG. 5. Referring to FIG. 7, the pixel driving transistor PDT includes a source, a drain, and a gate. A channel may be formed in a body of the pixel driving transistor PDT. The first pixel transistor T1 of the pixel circuit of the pixel of FIG. 5 is the pixel driving transistor PDT.

Figure 8:
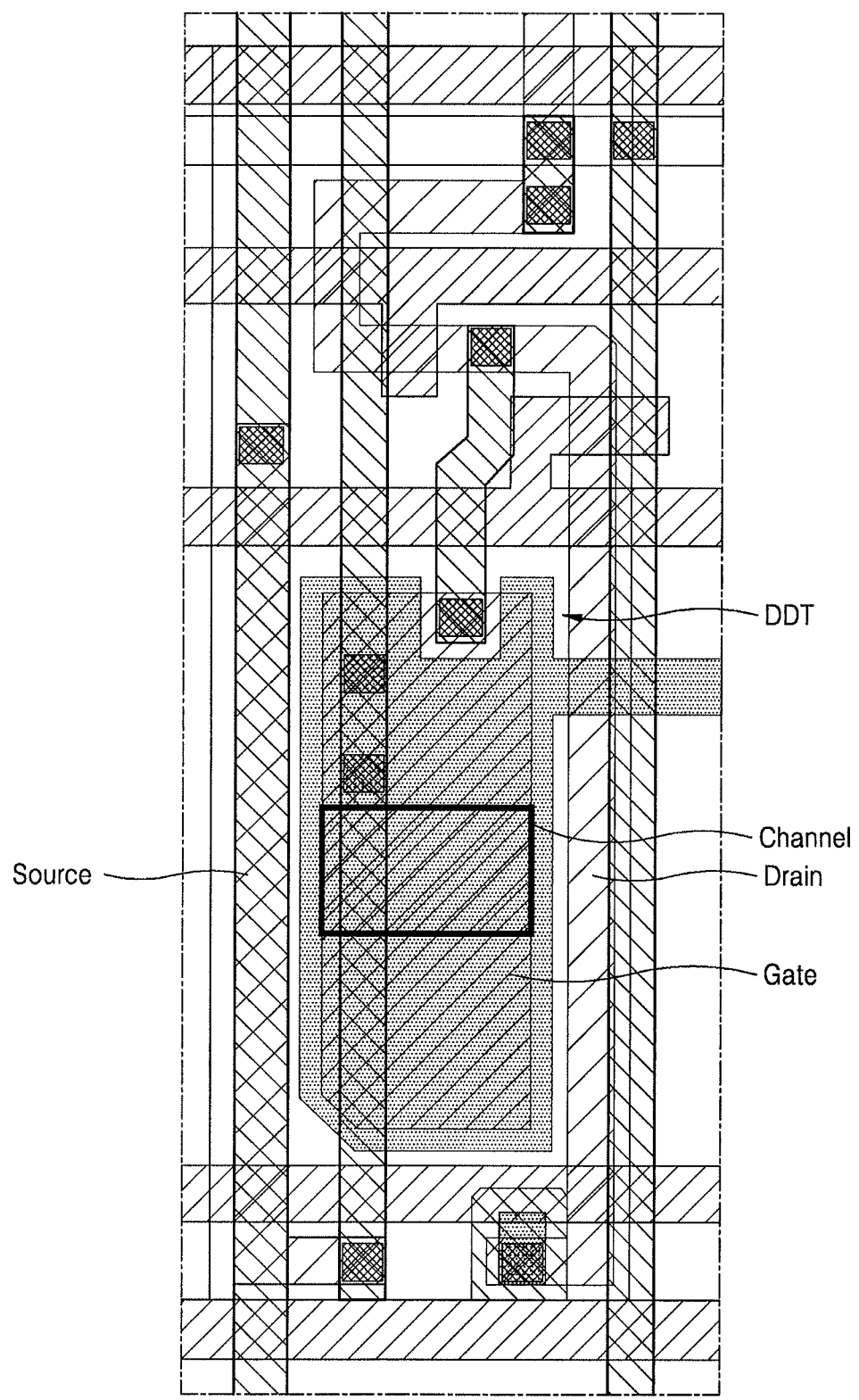
FIG. 8 illustrates an embodiment of a dummy driving transistor.

FIG. 8 illustrates an embodiment of a dummy driving transistor in the dummy pixel circuit of a dummy pixel of FIG. 6. Referring to FIG. 8, the dummy driving transistor DDT includes a source, a drain, and a gate. A channel may be formed in a body of the dummy driving transistor DDT. The first dummy transistor DT1 of the dummy pixel circuit of the dummy pixel of FIG. 6 is the dummy driving transistor DDT of the first dummy transistor DT1 of FIG. 6.

Comparing FIG. 7 with FIG. 8, the length of a channel (see FIG. 8) of the dummy driving transistor DDT may be shorter than that of a channel (see FIG. 7) of the pixel driving transistor PDT. When a channel length of a transistor is short, a voltage difference between a source and a drain of a corresponding transistor is reduced. As a result, power consumed in a channel of the corresponding transistor is reduced.

The first pixel circuit PC1 and the second pixel circuit PC2 may be designed to have the structure of FIG. 7, and the first dummy pixel circuit DC1 may be designed to have the structure of FIG. 8. In this case, consumption of power is reduced even more, in a case where the first light-emitting device E1 and the second light-emitting device E2 are all driven by the first dummy pixel circuit DC1, than in a case where the first light-emitting device E1 and the second light-emitting device E2 are respectively driven by the first pixel circuit PC1 and the second pixel circuit PC2.

Comparing FIG. 7 with FIG. 8, a width of the channel (see FIG. 8) of the dummy driving transistor DDT may be broader than that of the channel (see FIG. 7) of the pixel driving transistor PDT. When a channel width of a transistor is broad, an amount of current flowing through the channel of a corresponding transistor increases, and a plurality of light-emitting devices may be simultaneously driven.

The first pixel circuit PC1 and the second pixel circuit PC2 may be designed to have structure of FIG. 7, and the first dummy pixel circuit DC1 may be designed to have structure of FIG. 8. In this case, each of the first pixel circuit PC1 and the second pixel circuit PC2 may supply a current which drives only one light-emitting device, but the first dummy pixel circuit DC1 may supply a current which simultaneously drives a plurality of light-emitting devices.

Figure 9:
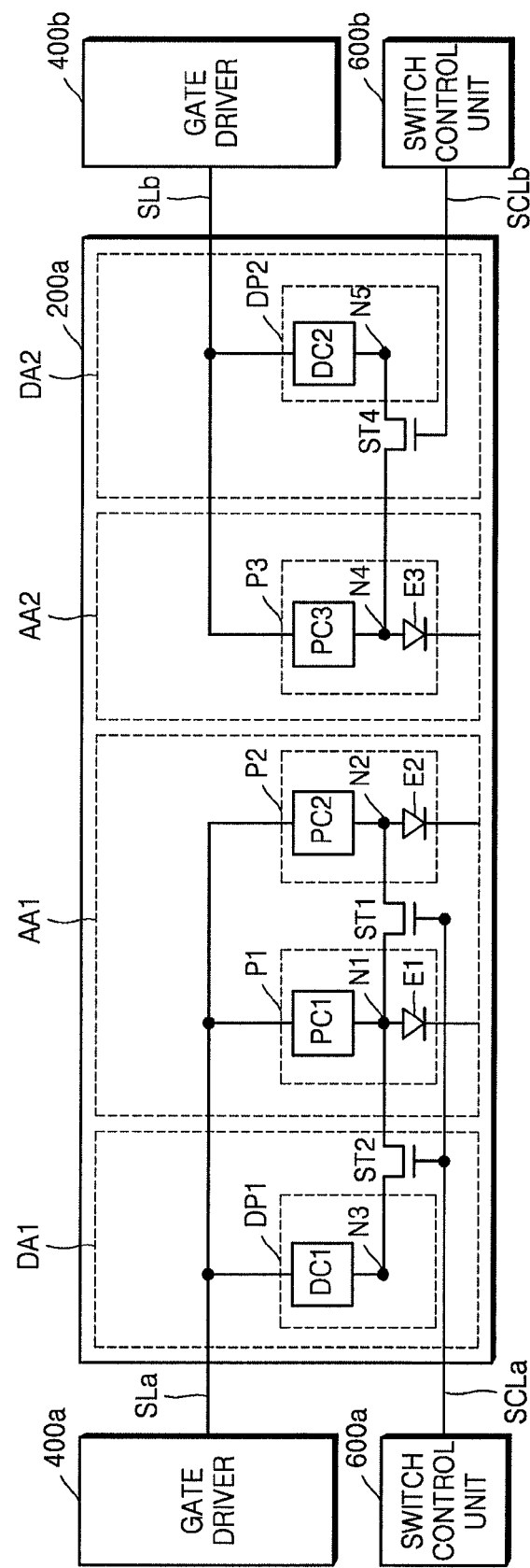
FIG. 9 illustrates an embodiment of how a display apparatus operates.

FIG. 9 illustrates an example of the operation of one embodiment of a display apparatus. Referring to FIG. 9, a first pixel P1 includes a first pixel circuit PC1 and a first light-emitting device E1 that is connected to the first pixel circuit PC1 through a first node N1. A second pixel P2 includes a second pixel circuit PC2 and a second light-emitting device E2 that is connected to the second pixel circuit PC2 through a second node N2. The second pixel P2 is in the same row as the first pixel P1 in the display unit 200.

A first dummy pixel DP1 includes a first dummy pixel circuit DC1 and a third node N3. The first dummy pixel DP1 may be in the same row as the first pixel P1. A third pixel P3 includes a third pixel circuit PC3 and a third light-emitting device E3 that is connected to the third pixel circuit PC3 through a fourth node N4. A second dummy pixel DP2 includes a second dummy pixel circuit DC2 and a fifth node N5.

The embodiment of FIG. 9 and the embodiment of FIG. 2A are different, in that some elements are added to the embodiment of FIG. 9. The following description focuses on some of the differences.

The first pixel P1 and the second pixel P2 may be in a first active area AA1. The first dummy pixel DP1 may be in a first dummy area DA1. The third pixel P3 may be in a second active area AA2. The second dummy pixel DP2 may be in a second dummy area DA2. The first active area AA1 may be left of a display unit 200a, and the second active area AA2 may be right of the display unit 200a.

A left gate driver 400a may output a scan signal to the first active area AA1 and the first dummy area DA1 through a first scan line SLa. A right gate driver 400b may output the scan signal to the second active area AA2 and the second dummy area DA2 through a second scan line SLb. When a first control signal has a first level, a left switch control unit 600a may electrically connect a plurality of light-emitting devices, in the first active area AA1, to a dummy pixel circuit in the first dummy area DA1 through a first switch control line SCLa. Also, when the first control signal has the first level, a right switch control unit 600b may electrically connect a plurality of light-emitting devices, in the second active area AA2, to a dummy pixel circuit in the second dummy area DA2 through a second switch control line SCLb.

For example, when the first control signal has the first level, the left switch control unit 600a may output a voltage that turns on a first switching transistor ST1 and a second switching transistor ST2, and thus may electrically connect a first node N1, a second node N2, and a third node N3. Likewise, when the first control signal has the first level, the right switch control unit 600b may output a voltage that turns on a fourth switching transistor ST4, and thus may electrically connect a fourth node N4 to a fifth node N5.

When a plurality of light-emitting devices in the first active area AA1 and a plurality of light-emitting devices in the second active area AA2 are driven by different dummy pixel circuits, the number of light-emitting devices which receive a driving current from one dummy pixel circuit are reduced. Because the number of light-emitting devices which receive a driving current from one dummy pixel circuit are reduced, a level of a current supplied from a dummy pixel circuit is lowered.

Figure 10:
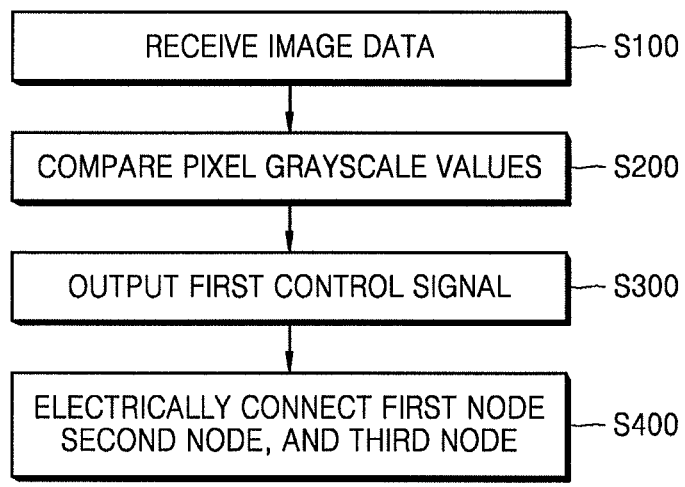
FIG. 10 illustrates an embodiment of a method for driving a display apparatus.

FIG. 10 illustrates an embodiment of a method for driving a display apparatus. The display apparatus may include a first pixel having a first light-emitting device connected to a first pixel circuit through a first node, a second pixel in the same row as the first pixel and including a second light-emitting device connected to a second pixel circuit through a second node, and a first dummy pixel including a first dummy pixel circuit having a third node.

Referring to FIG. 10, the method includes receiving image data (operation S100), comparing pixel grayscale values (operation S200), outputting a first control signal (operation S300), and electrically connecting a first node, a second node, and a third node (operation S400).

More specifically, in operation S100, image data is received. The image data may be received, for example, from an external source. The image data may be in the form of a signal transmitted over a wired interface or wirelessly. The image data may include information for generating an image of a visible light area visible to human eyes through the display apparatus.

In operation S200, the pixel grayscale values are compared, e.g., first and second pixel grayscale values in the received image data are compared.

In operation S300, the first control signal is output. For example, when the first pixel grayscale value is the same as the second pixel grayscale value, a control unit may output the first control signal having a first level. In one embodiment, operation S300 may include an operation of comparing the first pixel grayscale value with a threshold value. In this case, the control unit may output the first control signal having the first level only when the first pixel grayscale value is the same as the second pixel grayscale value and the first pixel grayscale value is greater than the threshold value.

In operation S400, the first node, the second node, and the third node are electrically connected. For example, the display apparatus may include a switch unit that electrically connects the first node, the second node, and the third node. When the first control signal having the first level is output from the control unit, the switch unit may electrically connect the first node, the second node, and the third node.

The method may further include an operation of applying a data voltage, corresponding to the first pixel grayscale value, to the first dummy pixel circuit. The method may further include an operation of emitting light having luminance corresponding to the first pixel grayscale value using the first and second light-emitting devices, which receive a driving current from the first dummy pixel circuit.

By way of summation and review, the pixels of a display apparatus consume a large amount of power. Reducing power consumption continues to be a focus of system designers. This is especially true for portable display apparatuses which are often battery driven. In accordance with one or more of the aforementioned embodiments, power consumption of the pixels in a display apparatus may be reduced using a dummy pixel.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:
1. A display apparatus, comprising:
a first pixel including a first light-emitting device connected to a first pixel circuit through a first node;
a second pixel in a same row as the first pixel and including a second light-emitting device connected to a second pixel circuit through a second node;
a first dummy pixel including a first dummy pixel circuit with a third node;
a controller to output a first control signal having a first level or a second level based on a first pixel grayscale value corresponding to the first pixel and a second pixel grayscale value corresponding to the second pixel; and a switch circuit to electrically connect the first node, the second node, and a third node when the first control signal has the first level.

2. The display apparatus as claimed in claim 1, wherein: when the first pixel grayscale value equals the second pixel grayscale value, the controller is to output the first control signal having the first level and the first dummy pixel circuit is to output a driving current to the first and second light-emitting devices, the driving current corresponding to the first pixel grayscale value.

3. The display apparatus as claimed in claim 2, wherein: the controller is to compare the first pixel grayscale value with a threshold value, and
the controller is to output the first control signal having the first level when the first pixel grayscale value is greater than the threshold value.

4. The display apparatus as claimed in claim 1, wherein: the switch circuit includes a plurality of switches to connect the first node, the second node, and the third node, and
the display apparatus includes a switch controller to control states of the plurality of switches based on the first control signal.

5. The display apparatus as claimed in claim 1, further comprising:
a gate driver to output a first scan signal to the first pixel circuit and the second pixel circuit; and
a source driver to output a data voltage, corresponding to the first pixel grayscale value, to the first pixel circuit of the first pixel and to output a data voltage, corresponding to the second pixel grayscale value, to the second pixel circuit of the second pixel in synchronization with the scan signal.

6. The display apparatus as claimed in claim 5, wherein, the gate driver is to output the first scan signal to the first dummy pixel circuit,
the source driver is to output a black data voltage to the first pixel circuit and the second pixel circuit based on the first control signal having the first level, and
a level of the black data voltage is equal to a level of a data voltage output by the source driver when a pixel grayscale value corresponds to black.

7. The display apparatus as claimed in claim 5, wherein: in response to the first control signal having the first level, the source driver is to output a data voltage, determined based on the first pixel grayscale value, to the first dummy pixel circuit, and
the first light-emitting device and the second light-emitting device emit light with luminance corresponding to the first pixel grayscale value.

8. The display apparatus as claimed in claim 5, further comprising:
a scan line to transfer the first scan signal, output from the gate driver, to the first and second pixel circuits; and
a switch connected between the gate driver and the scan line,
wherein the switch is to be opened based on the first control signal having the first level.

9. The display apparatus as claimed in claim 1, wherein the first pixel circuit includes:
a pixel driving transistor connected between a source voltage terminal and the first node, the pixel driving transistor to be controlled based on a level of a voltage of a first pixel node;
a pixel switching transistor connected between a first data voltage terminal and the first pixel node, the pixel switching transistor to be controlled based on a scan signal; and
a first pixel capacitor connected between the source voltage terminal and the first pixel node.

10. The display apparatus as claimed in claim 9, wherein the first dummy pixel circuit includes:
a dummy driving transistor connected between the source voltage terminal and the third node, the dummy driving transistor to be controlled based on a level of a voltage of a first dummy node;
a dummy switching transistor connected between a dummy data voltage terminal and the first dummy node, the dummy switching transistor to be controlled based on the scan signal; and
a first dummy capacitor connected between the source voltage terminal and the first dummy node.

11. The display apparatus as claimed in claim 10, wherein a channel length of the dummy driving transistor is shorter than a channel length of the pixel driving transistor.

12. The display apparatus as claimed in claim 10, wherein a channel width of the dummy driving transistor is greater than a channel width of the pixel driving transistor.

13. The display apparatus as claimed in claim 1, wherein the first pixel circuit includes:
a first pixel transistor connected between a second pixel node and a third pixel node, the first pixel transistor to be controlled based on a level of a voltage of a fourth node;
a second pixel transistor to be connected between the second pixel node and a data voltage terminal, the second pixel transistor to be controlled based on a first scan signal;
a third pixel transistor connected between the third pixel node and a fourth pixel node, the third pixel transistor to be controlled based on the first scan signal;
a fourth pixel transistor connected between the fourth pixel node and an initialization voltage terminal, the fourth pixel transistor to be controlled based on a second scan signal;
a fifth pixel transistor connected between the second pixel node and a source voltage terminal, the fifth pixel transistor to be controlled based on a second control signal;
a sixth pixel transistor connected between the third pixel node and the first node, the sixth pixel transistor to be controlled based on the second control signal;
a seventh pixel transistor connected between the first node and the initialization voltage terminal, the seventh pixel transistor to be controlled based on the second scan signal; and
a second pixel capacitor connected between the source voltage terminal and the fourth pixel node.

14. The display apparatus as claimed in claim 13, wherein the first dummy pixel circuit includes:
a first dummy transistor connected between a second dummy node and a third dummy node, the first dummy transistor to be controlled based on a level of a voltage of a fourth dummy node;
a second dummy transistor connected between the second dummy node and the data voltage terminal, the second dummy transistor to be controlled based on the scan signal;

a third dummy transistor connected between the third dummy node and a fourth dummy node, the third dummy transistor to be controlled based on the scan signal;

a fourth dummy transistor connected between the fourth dummy node and the initialization voltage terminal, the fourth dummy transistor to be controlled based on the second scan signal;

a fifth dummy transistor connected between the second dummy node and the source voltage terminal, the fifth dummy transistor to be controlled based on the second control signal;

a sixth dummy transistor connected between the third dummy node and the third node, the sixth dummy transistor to be controlled based on the second control signal;

a seventh dummy transistor connected between the third node and the initialization voltage terminal, the seventh dummy transistor to be controlled based on the second scan signal; and a second dummy capacitor connected between the source voltage terminal and the fourth dummy node.

15. The display apparatus as claimed in claim 1, further comprising:

a second dummy pixel including a second dummy pixel circuit; and a display including the first pixel and the second pixel are disposed, wherein, in response to the first control signal having the first level, the first dummy pixel circuit is to supply a driving current, corresponding to the first pixel grayscale value, to pixels in a same row as the first pixel among pixels left of the display, and wherein, in response to the first control signal having the first level, the second dummy pixel circuit is to supply a driving current, corresponding to the first pixel grayscale value, to pixels in a same row as the first pixel among pixels right of the display.

16. A display apparatus, comprising:

a plurality of pixels, each of the pixels including a light-emitting device connected to a pixel circuit; and a plurality of dummy pixels in a dummy area, each of the dummy pixels including a dummy circuit connected to the light-emitting devices of pixels in a same row, wherein, when pixels in a first row have a first pixel grayscale value, the dummy circuit in the first row is to supply a driving current to light-emitting devices in the first row and wherein the driving current is to correspond to the first pixel grayscale value.

17. The display apparatus as claimed in claim 16, wherein:

when the first pixel grayscale value is greater than a threshold value, the dummy circuit in the first row is to supply the driving current, corresponding to the first pixel grayscale value, to the light-emitting devices in the first row.

18. A method for controlling a display apparatus, the method comprising:

receiving image data;

comparing a first pixel grayscale value corresponding to a first pixel and a second pixel grayscale value corresponding to a second pixel;

when the first pixel grayscale value is equal to the second pixel grayscale value, outputting a first control signal having a first level; and electrically connecting a first node, a second node, and a third node based on the first control signal having the first level, wherein the first and second pixels are in a same row, and wherein:

the first node connects a first pixel circuit to a first light-emitting device in the first pixel;

the second node connects a second pixel circuit to a second light-emitting device in the second pixel, and the third node is included in or coupled to a dummy pixel circuit.

19. The method as claimed in claim 18, wherein outputting the first control signal includes:

comparing the first pixel grayscale value with a threshold value; and when the first pixel grayscale value is equal to the second pixel grayscale value and the first pixel grayscale value is greater than the threshold value, outputting the first control signal having the first level.

20. The method as claimed in claim 18, further comprising:

applying a data voltage, corresponding to the first pixel grayscale value, to the dummy pixel circuit; and emitting light having a luminance corresponding to the first pixel grayscale value using the first and second light-emitting devices, which receive a driving current from the dummy pixel circuit.

* * * * *